United States Patent
Omizo et al.

(10) Patent No.: US 6,686,222 B2
(45) Date of Patent: Feb. 3, 2004

(54) STACKED SEMICONDUCTOR DEVICE MANUFACTURING METHOD

(75) Inventors: Shoko Omizo, Kawasaki (JP); Atsushi Yoshimura, Yokosuka (JP); Mikio Matsui, Kawasaki (JP); Takao Sato, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/147,070

(22) Filed: May 17, 2002

(65) Prior Publication Data

US 2002/0187588 A1 Dec. 12, 2002

(51) Int. Cl.$^7$ .............................................. H01L 21/50
(52) U.S. Cl. ........................ 438/107; 438/109; 438/118
(58) Field of Search ................................. 438/107, 108, 438/109, 118, 456

(56) References Cited

U.S. PATENT DOCUMENTS

| | | | | | |
|---|---|---|---|---|---|
| 3,832,603 | A | * | 8/1974 | Cray et al. ................... | 361/790 |
| 4,868,712 | A | * | 9/1989 | Woodman .................... | 361/689 |
| 4,980,971 | A | * | 1/1991 | Bartschat et al. ............. | 29/833 |
| 5,014,419 | A | * | 5/1991 | Cray et al. ................... | 29/830 |
| 5,198,888 | A | * | 3/1993 | Sugano et al. ............... | 257/686 |
| 5,434,745 | A | * | 7/1995 | Shokrgozar et al. ........ | 361/735 |
| 5,631,497 | A | * | 5/1997 | Miyano et al. .............. | 257/668 |
| 5,661,087 | A | * | 8/1997 | Pedersen et al. ............ | 438/109 |
| 5,688,721 | A | * | 11/1997 | Johnson ....................... | 438/109 |
| 5,744,827 | A | * | 4/1998 | Jeong et al. ................. | 257/686 |
| 5,751,556 | A | * | 5/1998 | Butler et al. ................. | 361/773 |
| 5,753,536 | A | | 5/1998 | Sugiyama et al. .......... | 438/108 |
| 5,781,415 | A | * | 7/1998 | Itoh .............................. | 361/790 |
| 5,869,353 | A | * | 2/1999 | Levy et al. .................. | 438/109 |
| 5,897,341 | A | * | 4/1999 | Love et al. .................. | 438/125 |
| 5,908,304 | A | * | 6/1999 | Oudart et al. ............... | 438/109 |
| 6,020,629 | A | * | 2/2000 | Farnworth et al. .......... | 257/686 |
| 6,025,648 | A | * | 2/2000 | Takahashi et al. .......... | 257/778 |
| 6,137,163 | A | * | 10/2000 | Kim et al. ................... | 257/686 |
| 6,278,616 | B1 | * | 8/2001 | Gelsomini et al. .......... | 361/803 |
| 6,291,259 | B1 | * | 9/2001 | Chun .......................... | 438/106 |
| 6,313,522 | B1 | * | 11/2001 | Akram et al. ............... | 257/686 |
| 6,404,043 | B1 | * | 6/2002 | Isaak .......................... | 257/686 |
| 6,437,433 | B1 | * | 8/2002 | Ross ........................... | 257/692 |
| 6,451,624 | B1 | * | 9/2002 | Farnworth et al. .......... | 438/106 |
| 6,469,374 | B1 | * | 10/2002 | Imoto .......................... | 257/686 |
| 6,479,321 | B2 | * | 11/2002 | Wang et al. ................ | 438/109 |

FOREIGN PATENT DOCUMENTS

| | | | | | |
|---|---|---|---|---|---|
| JP | 09219490 | A | * | 8/1997 | .......... H01L/23/02 |
| JP | 10135267 | A | * | 5/1998 | .......... H01L/21/60 |
| JP | 10163414 | A | * | 6/1998 | ......... H01L/25/065 |

* cited by examiner

*Primary Examiner*—Matthew Smith
*Assistant Examiner*—Lex H. Malsawma
(74) *Attorney, Agent, or Firm*—Finnegan, Henderson, Farabow, Garrett & Dunner, L.L.P.

(57) ABSTRACT

In a semiconductor device manufacturing method, a semiconductor element is mounted on a substrate including first connection electrodes, first interconnections electrically connected to the first connection electrodes and a first alignment mark with the semiconductor element electrically connected to the first interconnections. Then, the substrate having the semiconductor element mounted thereon and a core substrate including second connection electrodes and second interconnections electrically connected to the second connection electrode and having adhesive layers formed on both surfaces thereof are positioned with respect to and stacked on each other based on recognition of the first alignment mark, thermo-compression bonding is performed at temperatures at which an adhesive agent of the adhesive layers is melted, without being cured, to temporarily fix the substrate having the semiconductor element mounted thereon on the core substrate by tackiness of the adhesive agent.

26 Claims, 9 Drawing Sheets

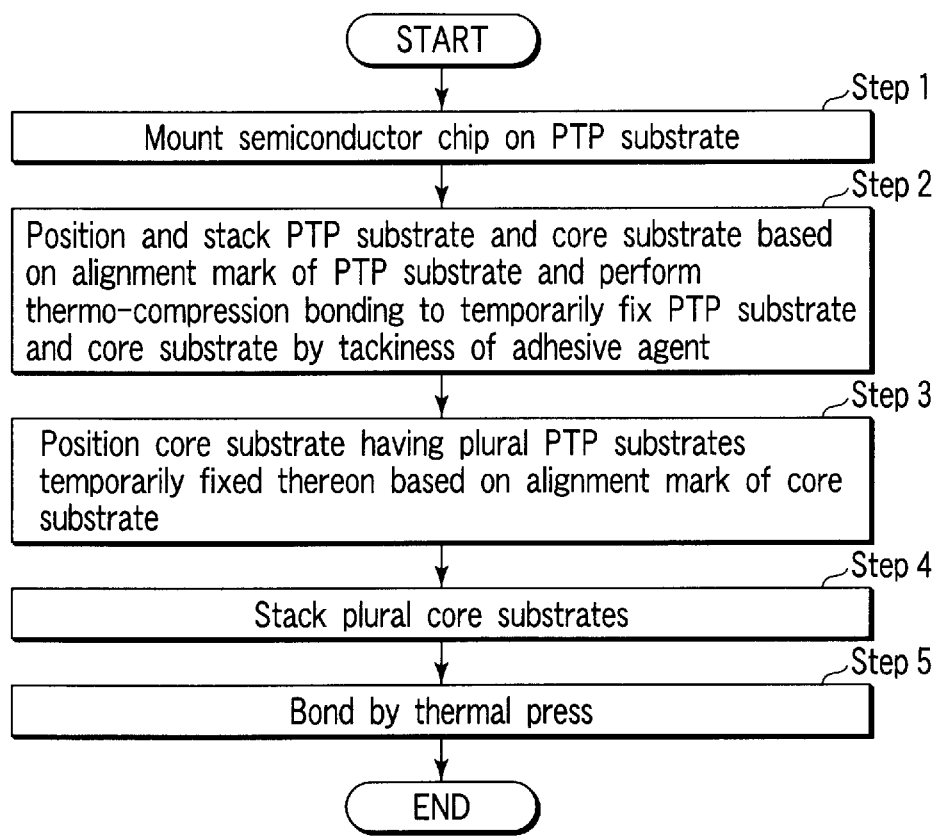
FIG. 10A
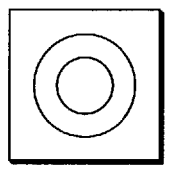　　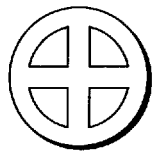
FIG. 10B　　FIG. 10C

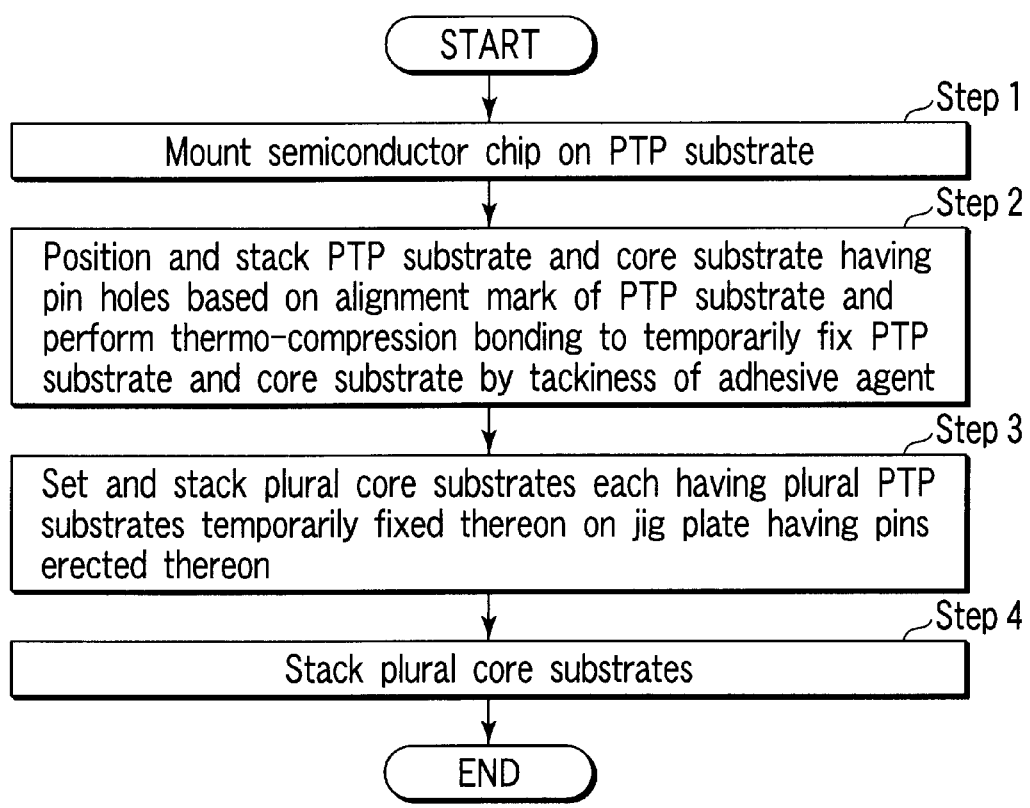
F I G. 12

STACKED SEMICONDUCTOR DEVICE MANUFACTURING METHOD

CROSS-REFERENCE TO RELATED APPLICATIONS

This application is based upon and claims the benefit of priority from the prior Japanese Patent Application No. 2001-149341, filed May 18, 2001, the entire contents of which are incorporated herein by reference.

BACKGROUND OF THE INVENTION

1. Field of the Invention

This invention relates to a semiconductor device manufacturing method and more particularly to a stacked package formed by stacking and mounting semiconductor elements.

2. Description of the Related Art

In recent years, semiconductor devices are formed by stacking and mounting semiconductor elements in order to mount the semiconductor elements with high density. The conventional stacked semiconductor devices (stacked packages) are described in, for example, Jpn. Pat. Appln. KOKAI Publication No. 9-219490, Jpn. Pat. Appln. KOKAI Publication No. 10-135267, Jpn. Pat. Appln. KOKAI Publication No. 10-163414 and the like.

The above conventional stacked packages are completed by packaging the elements into TSOPs (Thin Small Outline Packages), TCPs (Tape Carrier Packages), BGAs (Ball Grid Arrays) or the like, then individually laminating external terminals provided on the respective packages to stack the packages and making electrical connections thereof.

That is, a method of the conventional stacked package includes a package stacking step in addition to a packaging step of packaging the elements into each package. Therefore, the manufacturing method becomes a sequential process in which the number of steps is increased by a number corresponding to the number of stacked packages and there occurs a problem of an increase in the processing cost due to usage of the above process and an increase in the cost due to usage of members such as spacers used for individually stacking the packages.

BRIEF SUMMARY OF THE INVENTION

According to an aspect of the present invention, there is provided a method of manufacturing a semiconductor device, comprising mounting a semiconductor element on a substrate including first connection electrodes, first interconnections electrically connected to the first connection electrodes and a first alignment mark with the semiconductor element electrically connected to the first interconnections, and positioning and stacking the substrate having the semiconductor element mounted thereon on a core substrate including second connection electrodes and second interconnections electrically connected to the second connection electrodes and having adhesive layers formed on both surfaces thereof based on recognition of the first alignment mark, and performing thermo-compression bonding at temperatures at which an adhesive agent of the adhesive layers is melted, without being cured, to temporarily fix the substrate having the semiconductor element mounted thereon on the core substrate by tackiness of the adhesive agent.

According to another aspect of the present invention, there is provided a method of manufacturing a semiconductor device, comprising mounting semiconductor elements on substrates each including first connection electrodes, first interconnections electrically connected to the first connection electrodes and an alignment mark with the semiconductor element electrically connected to the first interconnections, positioning and stacking the substrates having the semiconductor elements mounted thereon on core substrates each including second connection electrodes, second interconnections electrically connected to the second connection electrodes and a positioning pin hole for stacking and having adhesive layers formed on both surfaces thereof based on recognition of the alignment mark, and performing thermo-compression bonding at temperatures at which an adhesive agent of the adhesive layers is melted, without being cured, to temporarily fix the substrates having the semiconductor elements mounted thereon on the core substrates by tackiness of the adhesive agent, mounting a plurality of core substrates on which the substrates having the semiconductor elements mounted thereon are temporarily fixed in a stacked form on a jig plate having a pin erected thereon by using the positioning pin holes of the core substrates, and bonding the plurality of core substrates by thermal press.

According to still another aspect of the present invention, there is provided a method of manufacturing a semiconductor device, comprising mounting semiconductor elements on substrates each including first connection electrodes, first interconnections electrically connected to the first connection electrodes and a first positioning pin hole with the semiconductor element electrically connected to the first interconnections, mounting the substrates having the semiconductor elements mounted thereon and a plurality of core substrates each including second connection electrodes, second interconnections electrically connected to the second connection electrodes and a second positioning pin hole for stacking and having adhesive layers formed on both surfaces thereof in a stacked form on a jig plate having a pin erected thereon by using the first and second positioning pin holes, and bonding the substrates having the semiconductor elements mounted thereon on the core substrates by thermal pressing and bonding the plurality of stacked core substrates.

BRIEF DESCRIPTION OF THE SEVERAL VIEWS OF THE DRAWING

FIG. 10A is a flowchart for illustrating a semiconductor device manufacturing method according to a second embodiment of the present invention;

FIGS. 10B and 10C are plan views showing examples of an alignment mark used for stacking and formed on a core substrate, for illustrating the semiconductor device manufacturing method according to the second embodiment of the present invention;

FIG. 12 is a flowchart for illustrating a semiconductor device manufacturing method according to a fourth embodiment of the present invention;

DETAILED DESCRIPTION OF THE INVENTION

[First Embodiment]

Figure 1:
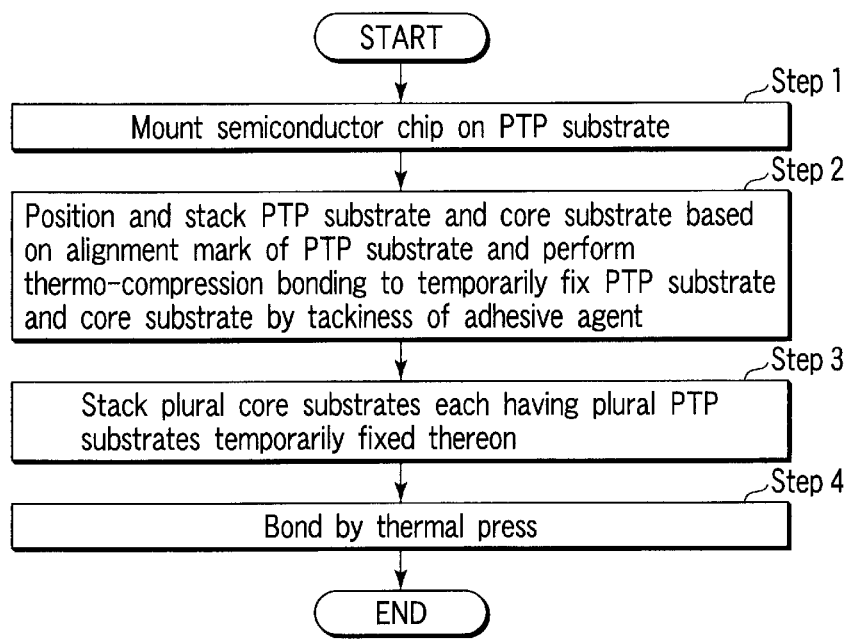
FIG. 1 is a flowchart for illustrating a semiconductor device manufacturing method according to a first embodiment of the present invention.
Figure 2:
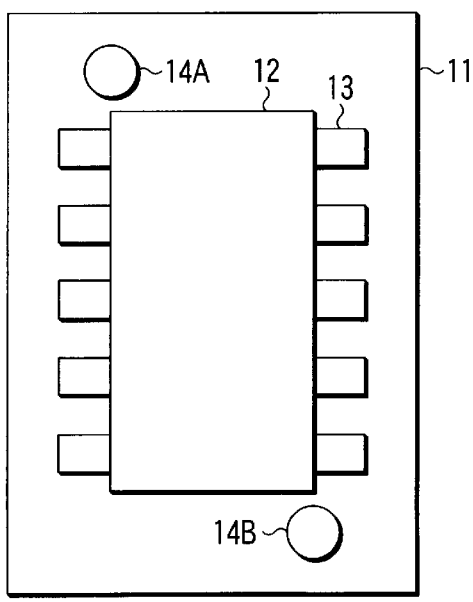
FIG. 2 is a plan view of a PTP substrate formed in a discrete form.
Figure 3:
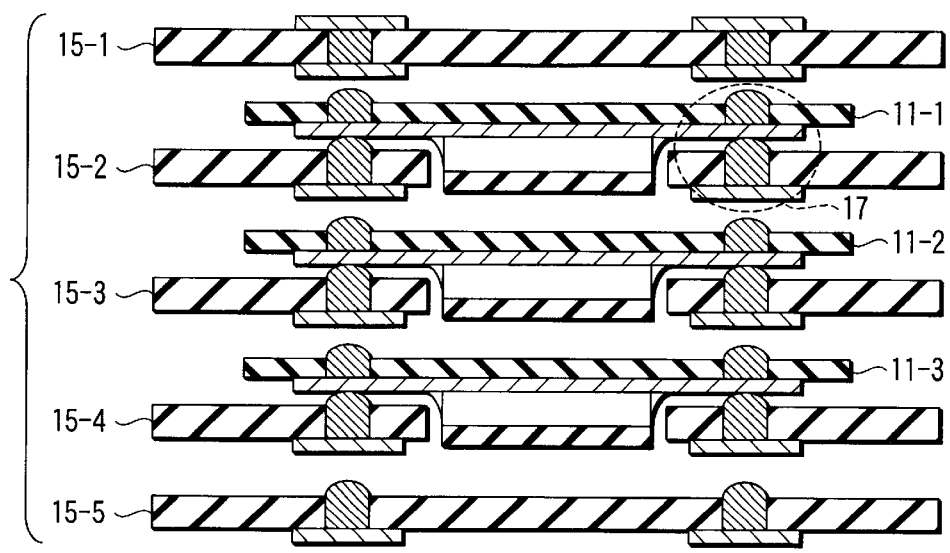
FIG. 3 is a cross sectional view showing a state in which PTP substrates shown in FIG. 2 and core substrates are stacked.

FIG. 1 is a flowchart for illustrating a semiconductor device manufacturing method according to a first embodiment of the present invention, FIG. 2 is a plan view of a PTP (Paper Thin Package) substrate formed in a discrete form, and FIG. 3 is a cross sectional view showing a state in which PTP substrates shown in FIG. 2 and core substrates are stacked. FIGS. 4 to 8 are enlarged cross sectional views showing examples of the structure of connection electrode portions of the PTP substrate and core substrate shown in FIG. 3 and show various combinations of metals filled in the vias.

First, as shown in FIGS. 1 and 2, a semiconductor chip (semiconductor element) 12 is mounted on a PTP substrate 11 formed of glass epoxy or polyimide, for example (step 1). The PTP substrate 11 includes connection electrodes, Cu interconnections 13 electrically connected to the connection electrodes, and positioning alignment marks 14A, 14B and the semiconductor chip 12 is mounted on the PTP substrate 11 with the semiconductor chip electrically connected to the Cu interconnections 13.

Next, the PTP substrate 11 with the above configuration and a core substrate including connection electrodes and interconnections electrically connected to the connection electrodes and having adhesive agents coated on both surfaces thereof are positioned with respect to and stacked on each other based on recognition of the alignment marks 14A, 14B. Then, the PTP substrate 11 and core substrate are subjected to thermo-compression bonding by use of a thermo-compression bonding tool at temperatures of 120° C. or less (for example, 60° C. to 120° C.) at which the epoxy-series adhesive agent is not cured so that they can be temporarily fixed on each other by tackiness of the adhesive agent (step 2). At this time, if a collet for attracting and picking up the PTP substrate 11 and having a heating tool incorporated therein is used, it becomes possible to successively transfer and temporarily fix the PTP substrates 11 onto the core substrates.

After this, as shown in FIG. 3, core substrates 15-1, 15-5 and core substrates 15-2 to 15-4 having PTP substrates 11-1 to 11-3 temporarily fixed thereon are stacked on one another (step 3) and then all of the substrates are bonded on one another by thermal press (step 4).

With the above manufacturing method, since the PTP substrates 11-1 to 11-3 are temporarily fixed on the core substrates 15-2 to 15-4, positional deviation of the PTP substrates 11-1 to 11-3 discretely formed can be suppressed even if the adhesive agent is melted at the time of thermal press. Further, the number of manufacturing steps can be reduced and a member used for stacking can be made unnecessary so as to attain the low cost. Further, since a member such as a spacer used for stacking can be made unnecessary, the stacked package can be made thin.

Figure 4:
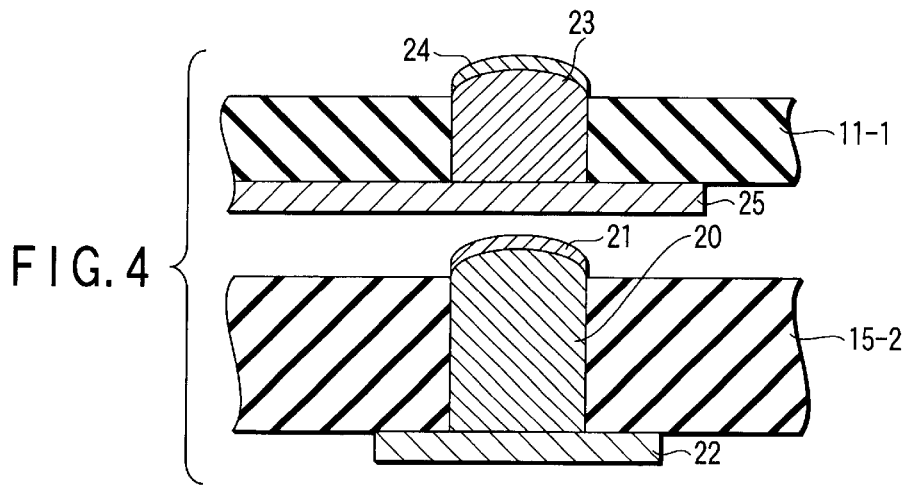
FIG. 4 is an enlarged cross sectional view showing an example of the structure of connection electrode portions of the PTP substrate and core substrate shown in FIG. 3.

FIG. 4 is an enlarged cross sectional view showing an example of the structure of connection electrode portions (a region surrounded by broken lines 17) of the PTP substrate and core substrate shown in FIG. 3. As shown in FIG. 4, a via is formed in the core substrate 15-2 and Cu (which is referred to as a Cu via) 20 acting as a connection electrode is filled in the via. An Sn plating layer 21 is formed on the junction surface side of the Cu via 20 which faces the PTP substrate 11-1. Further, on the rear surface side of the Cu via, a Cu land 22 is formed. A via is formed in a portion of the PTP substrate 11-1 which corresponds in position to the Cu via 20 and Cu (which is referred to as a Cu via) 23 acting as a connection electrode is filled in the via. An Sn plating layer 24 is formed on the front surface side of the Cu via 23 and a Cu land 25 is formed on the rear surface side thereof.

According to the connection electrode structure using Sn/Cu as described above, it is possible to form a package which is Pb-free.

Figure 5:
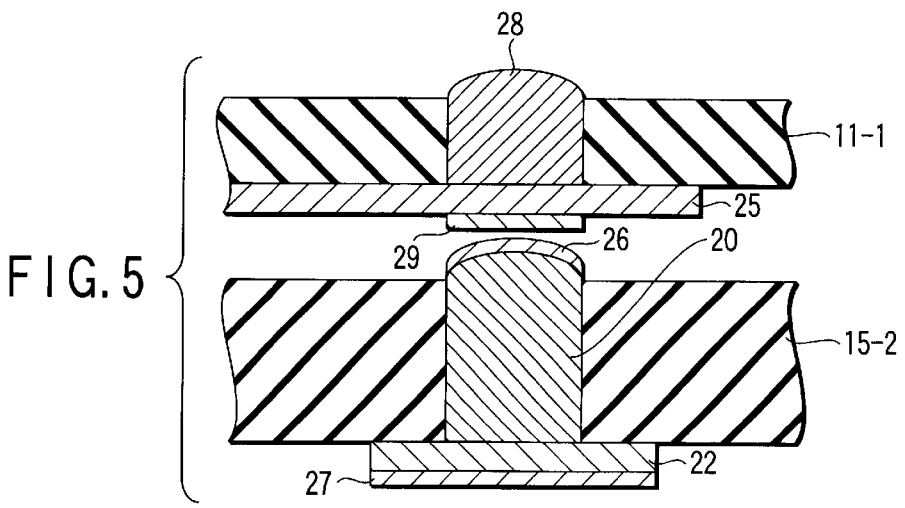
FIG. 5 is an enlarged cross sectional view showing another example of the structure of the connection electrode portions of the PTP substrate and core substrate shown in FIG. 3.

FIG. 5 is an enlarged cross sectional view showing another example of the structure of the connection electrode portions (the region surrounded by the broken lines 17) of the PTP substrate and core substrate shown in FIG. 3. As shown in FIG. 5, a via is formed in the core substrate 15-2 and Cu (which is referred to as a Cu via) 20 acting as a connection electrode is filled in the via. An Sn—Pb plating layer 26 is formed on the junction surface side of the Cu via 20 which faces the PTP substrate 11-1. Further, on the rear surface side of the Cu via, a Cu land 22 is formed and an Sn plating layer 27 is formed on the surface of the Cu land 22. A via is formed in a portion of the PTP substrate 11-1 which corresponds in position to the Cu via 20 and Sn—Ag (which is referred to as an Sn—Ag via) 28 acting as a connection electrode is filled in the via. A Cu land 25 is formed on the rear surface side of the Sn—Ag via 28. Further, an Sn—Ag plating layer 29 is formed on a portion of the Cu land 25 which corresponds in position to the Sn—Pb plating layer 26.

With the connection electrode structure using Sn—Ag/Sn—Pb as described above, the Sn—Pb plating layer 26 melts at the time of thermal press to suppress a variation in the height.

Figure 6:
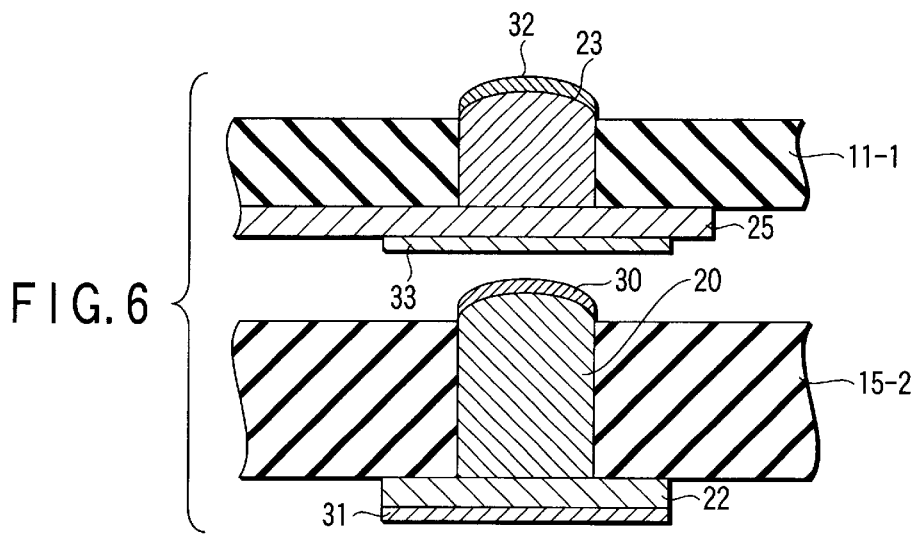
FIG. 6 is an enlarged cross sectional view showing still another example of the structure of the connection electrode portions of the PTP substrate and core substrate shown in FIG. 3.

FIG. 6 is an enlarged cross sectional view showing still another example of the structure of the connection electrode portions (the region surrounded by the broken lines 17) of the PTP substrate and core substrate shown in FIG. 3. As shown in FIG. 6, a via is formed in the core substrate 15-2 and Cu (which is referred to as a Cu via) 20 acting as a connection electrode is filled in the via. An Au plating layer 30 is formed on the junction surface side of the Cu via 20 which faces the PTP substrate 11-1. Further, on the rear surface side of the Cu via, a Cu land 22 is formed and an Au plating layer 31 is formed on the surface of the Cu land 22. A via is formed in a portion of the PTP substrate 11-1 which corresponds in position to the Cu via 20 and Cu (which is referred to as a Cu via) 23 acting as a connection electrode is filled in the via. An Au plating layer 32 is formed on the front surface side of the Cu via 23 and a Cu land 25 is formed on the rear surface side thereof. Further, an Au plating layer 33 is formed on a portion of the Cu land 25 which corresponds in position to the Au plating layer 30.

With the connection electrode structure using Au/Au as described above, the lands 22, 25 have the anti-oxidizing effect and since Au is soft, it is collapsed at the time of press and a variation in the height of the via can be suppressed.

Figure 7:
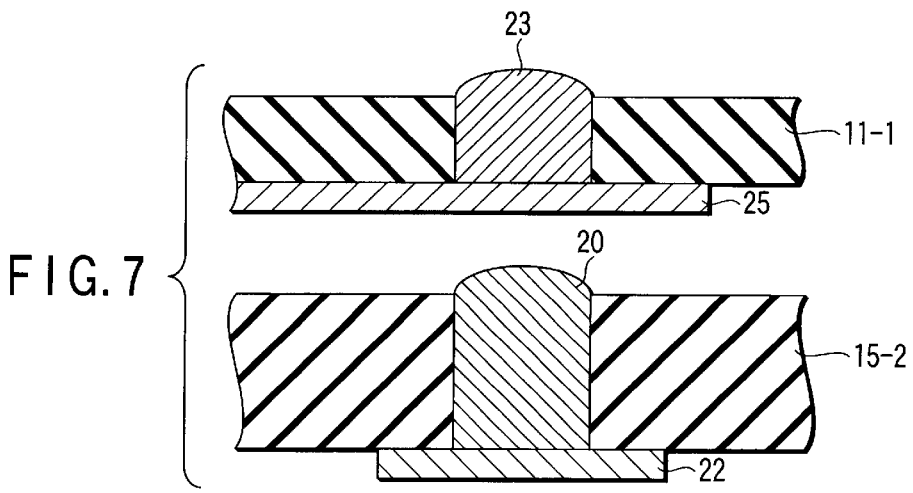
FIG. 7 is an enlarged cross sectional view showing another example of the structure of the connection electrode portions of the PTP substrate and core substrate shown in FIG. 3.

FIG. 7 is an enlarged cross sectional view showing a different example of the structure of the connection electrode portions (the region surrounded by the broken lines 17) of the PTP substrate and core substrate shown in FIG. 3. As shown in FIG. 7, a via is formed in the core substrate 15-2 and Cu (which is referred to as a Cu via) 20 acting as a connection electrode is filled in the via. A Cu land 22 is formed on the rear surface side of the Cu via 20 which lies in opposition to the junction surface thereof with the PTP substrate 11-1. A via is formed in a portion of the PTP substrate 11-1 which corresponds in position to the Cu via 20 and Cu (which is referred to as a Cu via) 23 acting as a connection electrode is filled in the via. A Cu land 25 is formed on the rear surface side of the Cu via 23.

The connection electrode structure using Cu/Cu as described above is inexpensive and can be used to form a package which is Pb-free.

Figure 8:
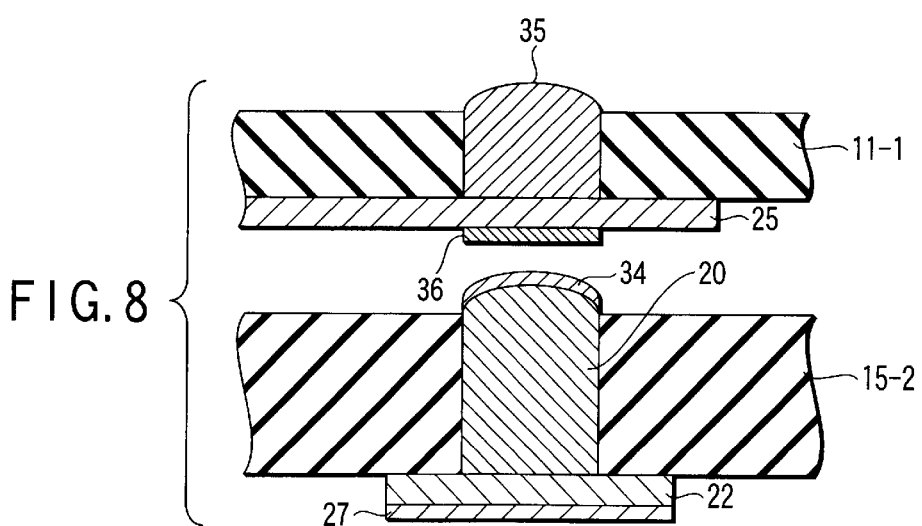
FIG. 8 is an enlarged cross sectional view showing still another example of the structure of the connection electrode portions of the PTP substrate and core substrate shown in FIG. 3.

FIG. 8 is an enlarged cross sectional view showing another different example of the structure of the connection electrode portions (the region surrounded by the broken lines 17) of the PTP substrate and core substrate shown in FIG. 3. As shown in FIG. 8, a via is formed in the core substrate 15-2 and Cu (which is referred to as a Cu via) 20 acting as a connection electrode is filled in the via. An Sn—Ag plating layer 34 is formed on the junction surface side of the Cu via 20 which faces the PTP substrate 11-1. Further, on the rear surface side of the Cu via, a Cu land 22 is formed and an Sn plating layer 27 is formed on the surface of the Cu land 22. A via is formed in a portion of the PTP substrate 11-1 which corresponds in position to the Cu via 20 and Sn (which is referred to as an Sn via) 35 acting as a connection electrode is filled in the via. A Cu land 25 is formed on the rear surface side of the Sn via 35. Further, an Sn plating layer 36 is formed on a portion of the Cu land 25 which corresponds in position to the Sn—Ag plating layer 34.

The connection electrode structure using Sn—Ag/Sn as described above can be used to form a package which is Pb-free and can suppress insufficient junction due to oxidation of the lands 25, 22.

Figure 9A:
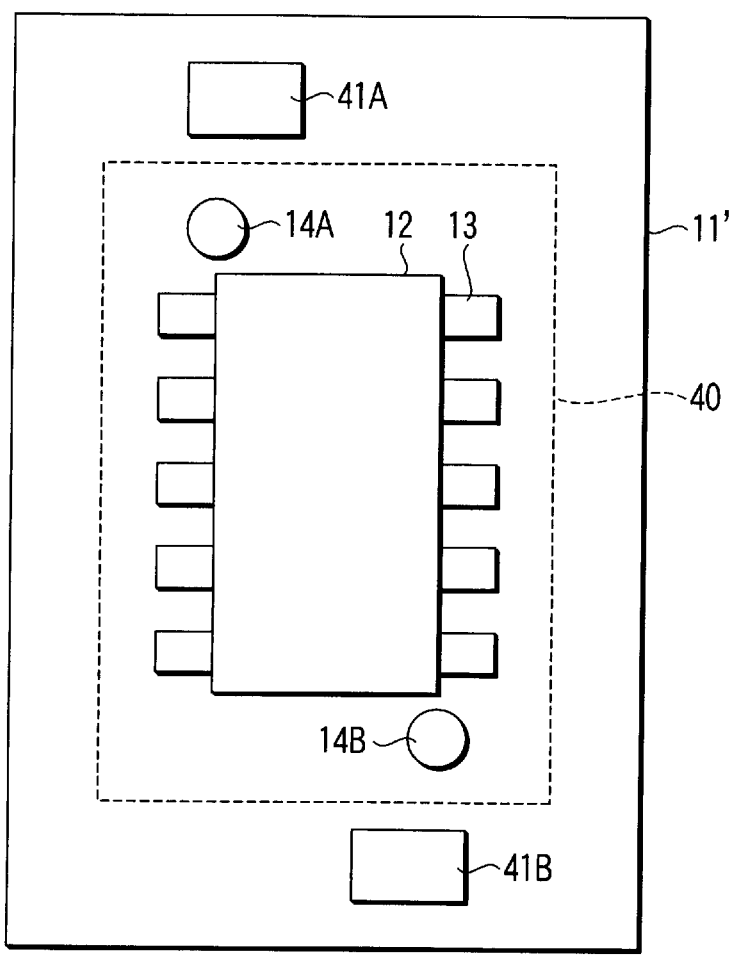
FIG. 9A is a plan view of a PTP substrate, for illustrating a modification of the PTP substrate shown in FIG. 2.
Figure 9B:
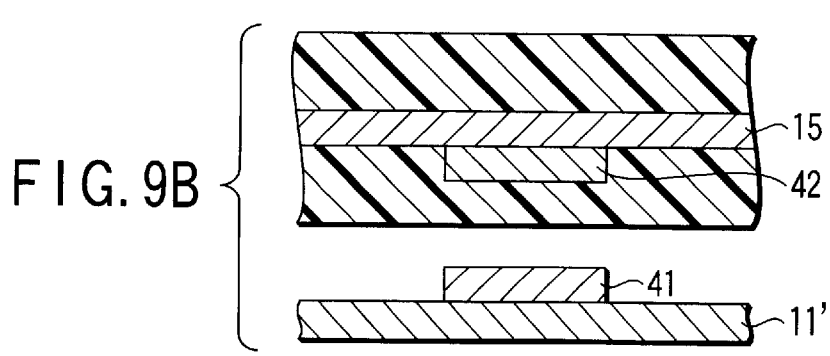
FIG. 9B is a partial cross sectional view showing a state in which a PTP substrate and a core substrate are stacked, for illustrating a modification of the PTP substrate shown in FIG. 2.

FIGS. 9A and 9B show modifications of the PTP substrate 11 shown in FIG. 2. As shown in FIG. 9A, dummy patterns 41A, 41B formed of Cu or the like are provided outside a portion of a PTP substrate 11' which is indicated by broken lines 40 and will be used as a product. Further, as shown in FIG. 9B, a dummy pattern 42 formed of Cu or the like is provided in an adhesive layer coated on the core substrate 15 in position corresponding to the dummy pattern 41.

By providing the dummy patterns 41, 42, the thickness of the adhesive agent is made thin and the amount of the adhesive layer which melts at the time of thermal press partially becomes small so as to further reduce the positional deviation between the core substrate 15 and the PTP substrate 11'.

In the above example, a case wherein the dummy patterns 41, 42 are provided on both of the PTP substrate 11' and core substrate 15 is explained, but it is possible to form the dummy pattern on one of them.

[Second Embodiment]

FIGS. 10A to 10C illustrate a semiconductor device manufacturing method according to a second embodiment of the present invention, and FIG. 10A is a flowchart and FIGS. 10B and 10C show examples of an alignment mark used for stacking and formed on a core substrate. In the present embodiment, an alignment mark for stacking is formed not only on a PTP substrate but also on the core substrate and the core substrate is positioned by use of the alignment marks for stacking. That is, first, a semiconductor chip 12 is mounted on a PTP substrate 11 formed of glass epoxy or polyimide, for example (step 1). Like the case of FIG. 2, the PTP substrate 11 includes connection electrodes, Cu interconnections 13 electrically connected to the connection electrodes, and positioning alignment marks 14A, 14B used at the time of stacking and the semiconductor chip 12 is mounted on the PTP substrate 11 with the semiconductor chip electrically connected to the Cu interconnections 13.

Next, the PTP substrate with the above configuration and a core substrate which includes connection electrodes, interconnections electrically connected to the connection electrodes and alignment marks for stacking as shown in FIGS. 10B and 10C patterned and formed at the same time as formation of the interconnections and has adhesive agents coated on both surfaces thereof are positioned with respect to and stacked on each other based on recognition of the alignment marks 14A, 14B of the PTP substrate 11. Then, the PTP substrate 11 and core substrate are subjected to thermo-compression bonding by use of a thermo-compression bonding tool at temperatures of 120° C. or less (for example, 60° C. to 120° C.) at which the epoxy-series adhesive agent is not cured so that they can be temporarily fixed on each other by tackiness of the adhesive agent (step 2). At this time, like the first embodiment described above, if a collet for attracting and picking up the PTP substrate and having a heating tool incorporated therein is used, it becomes possible to successively transfer and temporarily fix the PTP substrates onto the core substrates.

Next, after the core substrate having a plurality of PTP substrates temporarily fixed thereon is positioned by use of the alignment marks of the core substrate as shown in FIGS. 10B and 10C (step 3), a plurality of core substrates having the same structure as the core substrate thus obtained are stacked on one another (step 4) and then all of the substrates are bonded on one another by thermal press (step 5).

With the above manufacturing method, since the alignment marks for stacking formed on the core substrate are patterned and formed at the same time as formation of the interconnections, stacking deviation can be suppressed to a small extent of the patterning precision.

[Third Embodiment]

Figure 11:
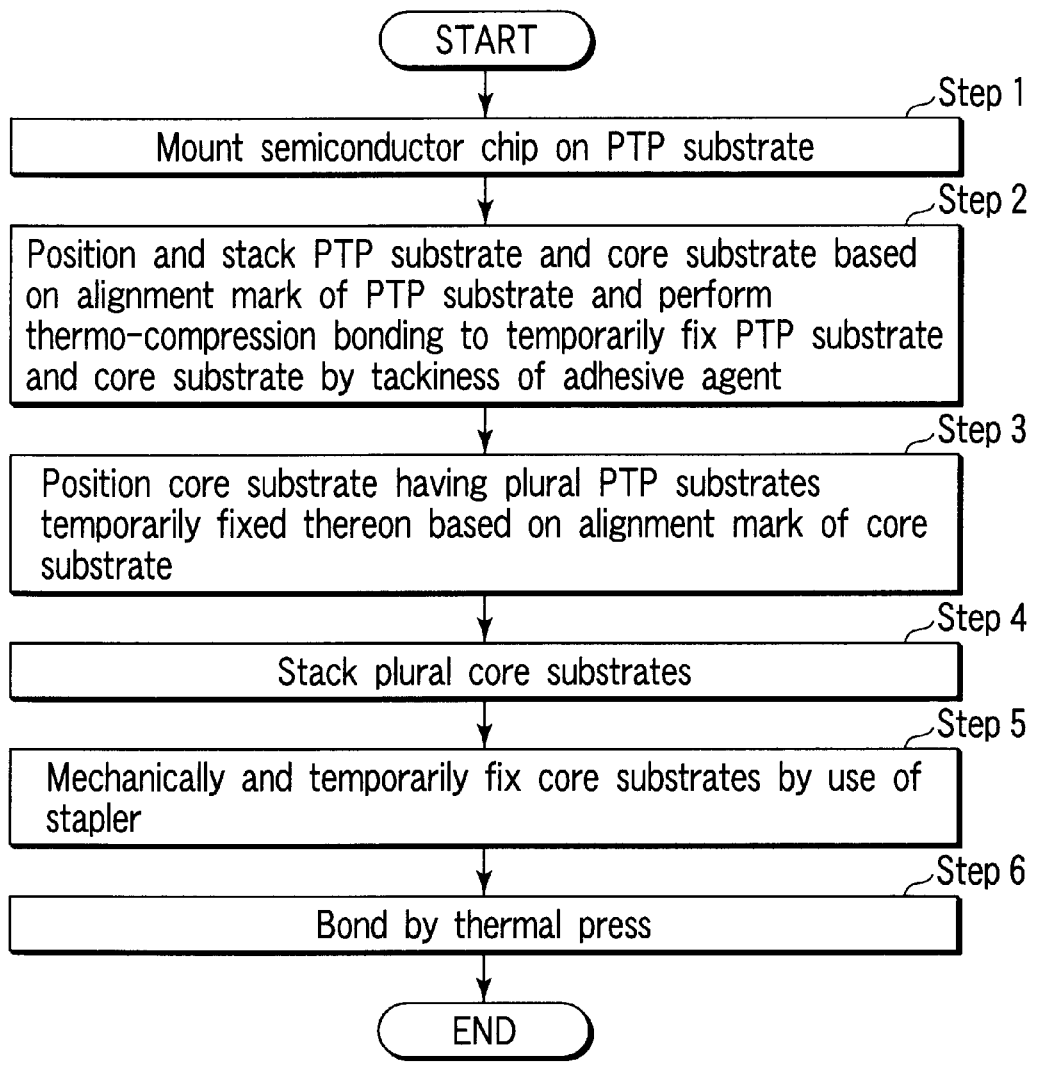
FIG. 11 is a flowchart for illustrating a semiconductor device manufacturing method according to a third embodiment of the present invention.

FIG. 11 is a flowchart for illustrating a semiconductor device manufacturing method according to a third embodiment of the present invention. First, a semiconductor chip 12 is mounted on a PTP substrate 11 formed of glass epoxy or polyimide, for example (step 1). Like the case of FIG. 2, the PTP substrate 11 includes connection electrodes, Cu interconnections 13 electrically connected to the connection electrodes and positioning alignment marks 14A, 14B used at the time of stacking and the semiconductor chip 12 is mounted on the PTP substrate 11 while it is electrically connected to the Cu interconnections 13.

Next, the PTP substrate with the above configuration and a core substrate which includes connection electrodes, interconnections electrically connected to the connection electrodes and alignment marks for stacking patterned and formed at the same time as formation of the interconnections and has adhesive agents coated on both surfaces thereof are positioned with respect to and stacked on each other based on recognition of the alignment marks of the PTP substrate. Then, the PTP substrate and core substrate are subjected to thermo-compression bonding by use of a thermo-compression bonding tool at temperatures of 120° C. or less (for example, 60° C. to 120° C.) at which the epoxy-series adhesive agent is not cured so that they can be temporarily fixed on each other by tackiness of the adhesive agent (step 2). At this time, if a collet for attracting and picking up the PTP substrate and having a heating tool incorporated therein is used, it becomes possible to successively transfer and temporarily fix the PTP substrates onto the core substrate.

Next, after the core substrate having a plurality of PTP substrates temporarily fixed thereon is positioned by use of the alignment marks of the core substrate (step 3), a plurality of core substrates having the same structure as the core substrate thus obtained are stacked on one another (step 4) and then the plurality of core substrates are mechanically and temporarily fixed on one another by use of a stapler, for example (step 5).

After this, the mechanically and temporarily fixed core substrates are bonded on one another by thermal press (step 6).

With the above manufacturing method, since the core substrate having the temporarily fixed PTP substrates mounted thereon and having the alignment marks for stacking is positioned and a plurality of core substrates are mechanically and temporarily fixed and then bonded by thermal press, stacking deviation can be further suppressed to a small extent of the patterning precision.

[Fourth Embodiment]

Figure 13:
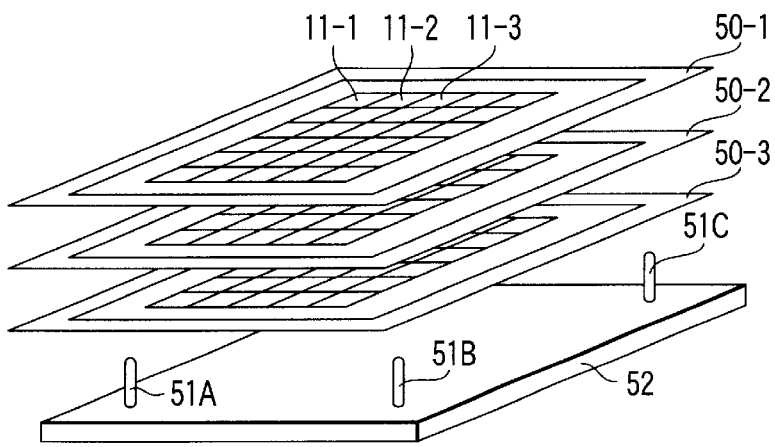
FIG. 13 is a perspective view showing a state in which a plurality of core substrates each having a plurality of PTP substrates temporarily fixed thereon are stacked, for illustrating the semiconductor device manufacturing method according to the fourth embodiment of the present invention.

FIG. 12 is a flowchart for illustrating a semiconductor device manufacturing method according to a fourth embodiment of the present invention. FIG. 13 is a perspective view showing a state in which a plurality of core substrates each having a plurality of PTP substrates temporarily fixed thereon are stacked on one another.

First, a semiconductor chip 12 is mounted on a PTP substrate 11 formed of glass epoxy or polyimide, for example (step 1). Like the case of FIG. 2, the PTP substrate 11 includes connection electrodes, Cu interconnections 13 electrically connected to the connection electrodes and positioning alignment marks 14A, 14B used at the time of stacking and the semiconductor chip 12 is mounted on the PTP substrate 11 with the semiconductor chip electrically connected to the Cu interconnections 13.

Next, PTP substrates with the same configuration as that described above are positioned with respect to and stacked on each of core substrates 50-1 to 50-3 including connection electrodes, interconnections electrically connected to the connection electrodes and positioning pin holes for stacking and having adhesive agents coated on both surfaces thereof based on recognition of the alignment marks. Then, the PTP substrates and core substrate are subjected to thermo-compression bonding by use of a thermo-compression bonding tool at temperatures of 120° C. or less (for example, 60° C. to 120° C.) at which the epoxy-series adhesive agent is not cured so that they can be temporarily fixed on each other by tackiness of the adhesive agent (step 2). At this time, if a collet for attracting and picking up the PTP substrate and having a heating tool incorporated therein is used, it becomes possible to successively transfer and temporarily fix the PTP substrates 11 onto the core substrate.

After this, as shown in FIG. 13, the core substrates 50-1 to 50-3 are stacked on one another by sequentially inserting pins 51A, 51B, 51C, ... of a jig plate 52 into the pin holes of the core substrates 50-1 to 50-3 (step 3).

Then, the PTP substrates 11-1, 11-2, 11-3, ... and the core substrates 50-1 to 50-3 are bonded by thermal press (step 4).

With the above manufacturing method, the same effect obtained in the manufacturing method according to the first to third embodiments can be attained.

[Fifth Embodiment]

Figure 14:
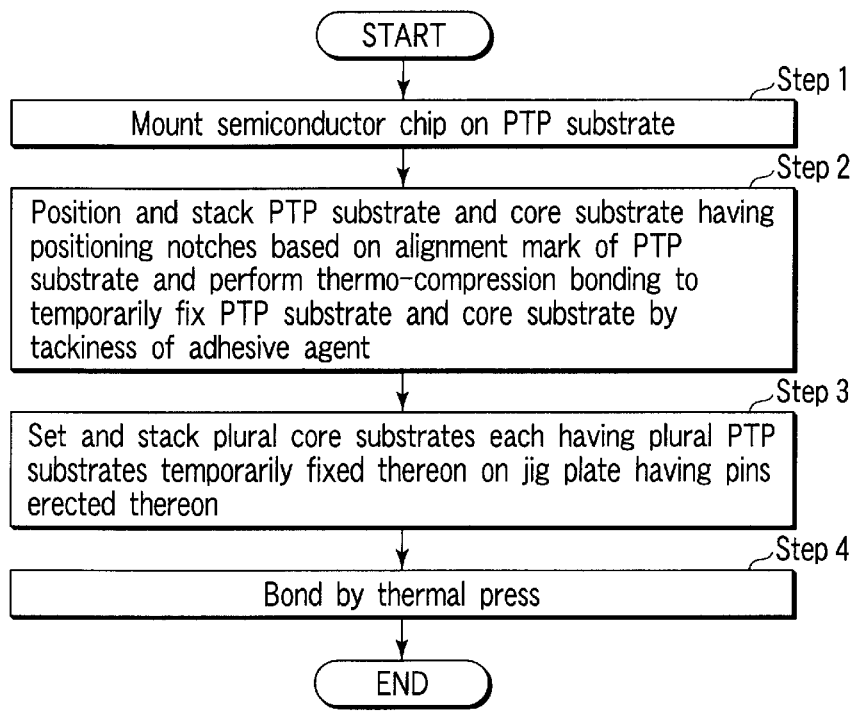
FIG. 14 is a flowchart for illustrating a semiconductor device manufacturing method according to a fifth embodiment of the present invention.

FIG. 14 is a flowchart for illustrating a semiconductor device manufacturing method according to a fifth embodiment of the present invention. First, a semiconductor chip 12 is mounted on a PTP substrate 11 formed of glass epoxy or polyimide, for example (step 1). Like the case of FIG. 2, the PTP substrate 11 includes connection electrodes, Cu interconnections 13 electrically connected to the connection electrodes and positioning alignment marks 14A, 14B used at the time of stacking and the semiconductor chip 12 is mounted on the PTP substrate 11 while it is electrically connected to the Cu interconnections 13.

Next, a plurality of PTP substrates with the same configuration as that described above are positioned with respect to and stacked on a core substrate including connection electrodes, interconnections electrically connected to the connection electrodes and notches used for positioning at the time of stacking and having adhesive agents coated on both surfaces thereof based on recognition of the alignment marks of each PTP substrate. Then, the PTP substrates and core substrate are subjected to thermo-compression bonding by use of a thermo-compression bonding tool at temperatures of 120° C. or less (for example, 60° C. to 120° C.) at which the epoxy-series adhesive agent is not cured so that they can be temporarily fixed on each other by tackiness of the adhesive agent (step 2). At this time, if a collet for attracting and picking up the PTP substrate and having a heating tool incorporated therein is used, it becomes possible to successively transfer and temporarily fix the PTP substrates onto the core substrate.

After this, a plurality of core substrates having the positioning notches are set on a jig plate having pins erected thereon and stacked in the same manner as described in the fourth embodiment shown in FIG. 13 (step 3).

Then, the PTP substrates and the core substrates are bonded by thermal press (step 4).

With the above manufacturing method, basically, the same effect and operation obtained in the semiconductor device manufacturing method according to the fourth embodiment can be attained.

[Sixth Embodiment]

Figure 15:
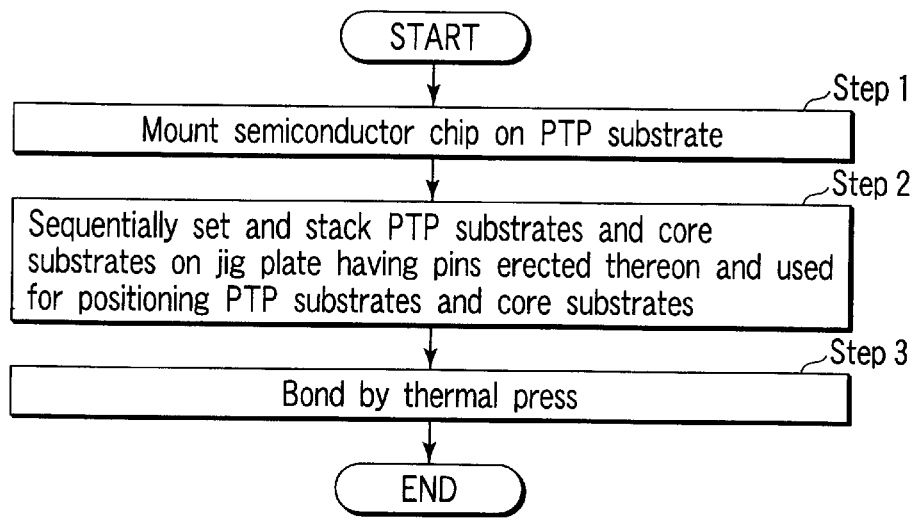
FIG. 15 is a flowchart for illustrating a semiconductor device manufacturing method according to a sixth embodiment of the present invention.
Figure 16:
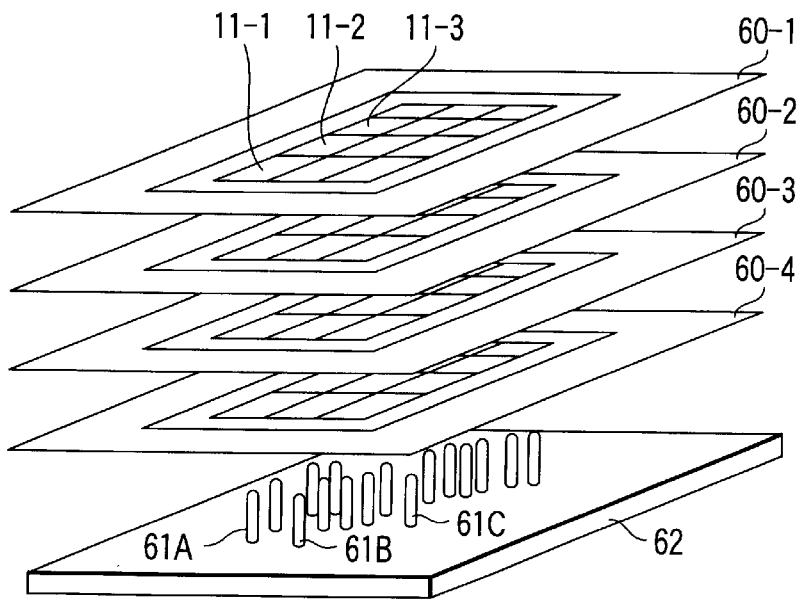
FIG. 16 is a perspective view showing a state in which a plurality of PTP substrates and core substrates are stacked, for illustrating the semiconductor device manufacturing method according to the sixth embodiment of the present invention.

FIG. 15 is a flowchart for illustrating a semiconductor device manufacturing method according to a sixth embodiment of the present invention. FIG. 16 is a perspective view showing a state in which a plurality of PTP substrates and core substrates in the present embodiment are stacked. First, a semiconductor chip 12 is mounted on a PTP substrate 11 formed of glass epoxy or polyimide, for example (step 1). The PTP substrate 11 includes connection electrodes, Cu interconnections 13 electrically connected to the connection electrodes and positioning pin holes used at the time of stacking and the semiconductor chip 12 is mounted on the PTP substrate 11 while it is electrically connected to the Cu interconnections 13.

Next, as shown in FIG. 16, PTP substrates 11-1, 11-2, 11-3, ... with the same configuration as that described above and core substrates 60-1 to 60-4 each including connection electrodes, interconnections electrically connected to the connection electrodes and positioning pin holes for stacking and having adhesive agents coated on both surfaces thereof are sequentially set and stacked on a jig plate 62 having positioning pins 61A, 61B, 61C, ... erected thereon (step 2).

After this, the core substrates 60-1 to 60-4 and the PTP substrates 11-1, 11-2, 11-3, ... are collectively bonded by thermal press (step 3).

With the above manufacturing method, the stacking process can be simplified, the number of steps can be reduced, a member used for stacking can be made unnecessary and the cost can be lowered.

As described above, according to one aspect of this invention, a semiconductor device manufacturing method in which the number of steps can be reduced, a member used for stacking can be made unnecessary and the cost can be lowered can be attained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:

mounting a semiconductor element on a substrate including first connection electrodes, first interconnections electrically connected to said first connection electrodes and a first alignment mark with said semiconductor element electrically connected to said first interconnections, positioning and stacking said substrate having said semiconductor element mounted thereon on a core substrate based on recognition of said first alignment mark, said core substrate having second connection electrodes and second interconnections electrically connected to the second connection electrodes, and having adhesive layers formed on both surfaces thereof; and performing thermo-compression bonding at temperatures of 120° C. or less at which an adhesive agent of said adhesive layers is melted, without being cured, to temporarily fix the substrate having said semiconductor element mounted thereon on said core substrate by tackiness of said adhesive agent.

2. The method according to claim 1, further comprising stacking a plurality of core substrates on each of which said substrate having said semiconductor element mounted thereon is temporarily fixed while positioning said core substrates in a three-dimensional fashion after the temporary fixing, and then bonding said core substrates by thermal pressing.

3. The method according to claim 2, wherein said substrate having said semiconductor element mounted thereon and portions of said second connection electrodes of said core substrate having said adhesive layers formed on both surfaces thereof include vias filled with metal and metal portions filled in said vias are connected together to form alloy layers at said thermal pressing.

4. The method according to claim 3, wherein metal filled in said vias is one material selected from a group of Cu, Sn, and Sn—Ag.

5. The method according to claim 4, further comprising forming a plating layer formed on a surface of said metal filled in said vias and formed of one material selected from a group of Sn, Sn—Ag, Sn—Pb and Au.

6. The method according to claim 2, wherein said core substrate has a second alignment mark for stacking and the three-dimensional positioning is performed by use of said first and second alignment marks.

7. The method according to claim 1, further comprising stacking a plurality of core substrates on each of which said substrate having said semiconductor element mounted thereon is temporarily fixed while three-dimensionally positioning said core substrates after said temporary fixing, mechanically and temporarily fixing said plurality of core substrates and then bonding to said plurality of core substrates which are mechanically and temporarily fixed by thermal press.

8. The method according to claim 7, wherein said core substrate has a second alignment mark for stacking and said three-dimensional positioning is performed by use of said first and second alignment marks.

9. The method according to claim 1, wherein a dummy pattern is used for partially reducing the thickness of said adhesive layer and formed on part of a region provided in at least one of said core substrate and said substrate hving said semiconductor element mounted thereon and removed at completion.

10. The method according to claim 1, wherein the temperatures of 120° C. or less at which an adhesive agent of said adhesive layers is melted, without being cured, are within the range of between 60 and 120° C.

11. A method of manufacturing a semiconductor device, comprising:

mounting semiconductor elements on substrates each including first connection electrodes, first interconnections electrically connected to said first connection electrodes and an alignment mark with said semiconductor element electrically connected to said first interconnections, positioning and stacking said substrates having said semiconductor elements mounted thereon on core substrates based on recognition of said alignment marks, said core substrates each having second connection electrodes, second interconnections electrically connected to the second connection electrodes and a positioning pin hole for stacking, and having adhesive layers on both surfaces thereof; and performing thermo-compression bonding at temperatures of 120° C. or less at which an adhesive agent of said adhesive layers is melted, without being cured, to temporarily fix said substrates having said semiconductor elements mounted thereon on said core substrate by tackiness of said adhesive agent, mounting a plurality of core substrates on which said substrates having said semiconductor elements mounted thereon are temporarily fixed in a stacked form on a jig plate having a pin erected thereon by using said positioning pin holes, and bonding said plurality of core substrates by thermal pressing.

12. The method according to claim 11, wherein said substrate having said semiconductor element mounted thereon and portions of said second connection electrodes of the core substrate having said adhesive layers formed on both surfaces thereof include vias filled with metal and metal portions filled in said vias are connected together to form alloy layers at said thermal pressing.

13. The method according to claim 11, further comprising forming a dummy pattern used for partially reducing the thickness of said adhesive layer and formed on part of a region provided in at least one of said core substrate and said substrate having said semiconductor element mounted thereon and removed at completion.

14. The method according to claim 11, wherein the temperatures of 120° C. or less at which an adhesive agent of said adhesive layers is melted, without being cured, are within the range of between 60 and 120° C.

15. A method of manufacturing a semiconductor device comprising:

mounting a semiconductor element on a substrate which has first connection electrodes, first interconnections electrically connected to said first connection electrodes and a first alignment mark, in a state where the semiconductor element is electrically connected to said first interconnections;

transferring the substrate on which the semiconductor element is mounted, by attraction by means of a collet which has a heating tool incorporated therein;

positioning and stacking a core substrate and the substrate on which the semiconductor element is mounted based on a recognition of the first alignment mark, said core substrate having second connection electrodes and second interconnections electrically connected to the second connection electrodes and having adhesive layers on both surfaces thereof; and performing a thermo-compression bonding at temperatures at which an adhesive agent of said adhesive layers is melted without being cured, by using the collet to temporarily fix the substrate on which the semiconductor element is mounted on said core substrate by tackiness of the adhesive agent.

16. The method according to claim 15, further comprising stacking a plurality of core substrates on each of said substrate, wherein each of said substrates having said semiconductor element mounted thereon, is temporarily fixed while positioning said core substrates in a three-dimensional fashion after the temporary fixing, and then bonding said core substrates by thermal pressing.

17. The method according to claim 16, wherein said substrate having said semiconductor element mounted thereon and portions of said second connection electrodes of said core substrate having said adhesive layers formed on both surfaces thereof include vias filled with metal and metal portions filled in said vias are connected together to form alloy layers at said thermal pressing.

18. The method according to claim 17, wherein metal filled in said vias is one material selected from a group of Cu, Sn, and Sn—Ag.

19. The method according to claim 18, further comprising forming a plating layer formed on a surface of said metal filled in said vias and formed of one material selected from a group of Sn, Sn—Ag, Sn—Pb and Au.

20. The method according to claim 16, wherein said core substrate has a second alignment mark for stacking and the three-dimensional positioning is performed by use of said first and second alignment marks.

21. The method according to claim 15, further comprising stacking a plurality of core substrates on each of said substrate, wherein each of said substrates having said semiconductor element mounted thereon, is temporarily fixed while three-dimensionally positioning said core substrates after said temporary fixing, mechanically and temporarily fixing said plurality of core substrates and then bonding said plurality of core substrates which are mechanically and temporarily fixed by thermal pressing.

22. The method according to claim 21, wherein said core substrate has a second alignment mark for stacking and said three-dimensional positioning is performed by use of said first and second alignment marks.

23. The method according to claim 15, wherein a dummy pattern is used for partially reducing the thickness of said adhesive layer and formed on part of a region provided in at least one of said core substrate and said substrate having said semiconductor element mounted thereon and removed at completion.

24. A method of manufacturing a semiconductor device comprising:

mounting semiconductor elements on substrates each including first connection electrodes, first interconnections electrically connected to said first connection electrodes and an alignment mark, in a state where the semiconductor elements are electrically connected to said first interconnections;

transferring the substrates on which said semiconductor elements are mounted by attraction by means of a collet which has a heating tool incorporated therein;

positioning and stacking the substrates on which the semiconductor elements are mounted on core substrates based on recognition of said alignment marks, said core substrates each having adhesive layers formed on both surfaces thereof and having second connection electrodes, second interconnections electrically connected to the second connection electrodes and a positioning pin hole for stacking;

performing thermo-compression bonding at temperatures at which an adhesive agent of the adhesive layers is melted, without being cured, to temporarily fix the substrates on which the semiconductor elements are mounted on said core substrates by tackiness of the adhesive agent;

mounting a plurality of core substrates on said substrates, wherein said substrates having said semiconductor elements mounted thereon, are temporarily fixed in a stacked form on a jig plate having a pin erected thereon by using said positioning pin holes; and bonding said plurality of core substrates by thermal pressing.

25. The method according to claim 24, wherein said substrate having said semiconductor element mounted thereon and portions of said second connection electrodes of the core substrate having said adhesive layers formed on both surfaces thereof include vias filled with metal and metal portions filled in said vias are connected together to form alloy layers at said thermal pressing.

26. The method according to claim 24, further comprising forming a dummy pattern used for partially reducing the thickness of said adhesive layer and formed on part of a region provided in at least one of said core substrate and said substrate having said semiconductor element mounted thereon and removed at completion.

* * * * *

UNITED STATES PATENT AND TRADEMARK OFFICE
CERTIFICATE OF CORRECTION

PATENT NO. : 6,686,222 B2
DATED : February 3, 2004
INVENTOR(S) : Omizo et al.

It is certified that error appears in the above-identified patent and that said Letters Patent is hereby corrected as shown below:

<u>Title page,</u>
Insert item:
  -- [30]  Foreign Applications Priority Data

Japan 2001-149341  May 18, 2001 --

<u>Column 10,</u>
Line 34, change "hving" to -- having --.

Signed and Sealed this

Twentieth Day of April, 2004

JON W. DUDAS
*Acting Director of the United States Patent and Trademark Office*